United States Patent
Byun et al.

(10) Patent No.: US 11,680,172 B2
(45) Date of Patent: Jun. 20, 2023

(54) PHOTOCURABLE COATING COMPOSITION FOR FORMING LOW REFRACTIVE LAYER

(71) Applicant: LG CHEM, LTD., Seoul (KR)

(72) Inventors: Jin Seok Byun, Daejeon (KR); Jae Young Kim, Daejeon (KR); Boo Kyung Kim, Daejeon (KR); Seok Hoon Jang, Daejeon (KR); Yeong Rae Chang, Daejeon (KR)

(73) Assignee: LG Chem, Ltd., Seoul (KR)

( * ) Notice: Subject to any disclaimer, the term of this patent is extended or adjusted under 35 U.S.C. 154(b) by 133 days.

(21) Appl. No.: 15/762,383

(22) PCT Filed: Feb. 14, 2017

(86) PCT No.: PCT/KR2017/001609
§ 371 (c)(1),
(2) Date: Mar. 22, 2018

(87) PCT Pub. No.: WO2017/142291
PCT Pub. Date: Aug. 24, 2017

(65) Prior Publication Data
US 2018/0265710 A1    Sep. 20, 2018

(30) Foreign Application Priority Data

Feb. 19, 2016    (KR) ........................ 10-2016-0019945
Feb. 13, 2017    (KR) ........................ 10-2017-0019349

(51) Int. Cl.

| | | |
|---|---|---|
| *C09D 5/00* | (2006.01) | |
| *C09D 4/00* | (2006.01) | |
| *C09D 7/40* | (2018.01) | |
| *C09D 7/62* | (2018.01) | |
| *C08J 7/04* | (2020.01) | |
| *G02B 1/111* | (2015.01) | |
| *G02B 1/14* | (2015.01) | |
| *G03F 7/004* | (2006.01) | |
| *G03F 7/027* | (2006.01) | |
| *G03F 7/038* | (2006.01) | |
| *G03F 7/075* | (2006.01) | |
| *C08J 7/043* | (2020.01) | |
| *C08J 7/044* | (2020.01) | |
| *C08J 7/046* | (2020.01) | |
| *C08K 9/00* | (2006.01) | |
| *G03F 7/09* | (2006.01) | |
| *C08K 3/36* | (2006.01) | |

(52) U.S. Cl.
CPC .............. *C09D 5/006* (2013.01); *C08J 7/042* (2013.01); *C08J 7/043* (2020.01); *C08J 7/044* (2020.01); *C08J 7/046* (2020.01); *C09D 4/00* (2013.01); *C09D 7/62* (2018.01); *C09D 7/67* (2018.01); *G02B 1/111* (2013.01); *G02B 1/14* (2015.01); *G03F 7/0047* (2013.01); *G03F 7/027* (2013.01); *G03F 7/038* (2013.01); *G03F 7/0755* (2013.01); *C08J 2301/12* (2013.01); *C08J 2483/07* (2013.01); *C08K 3/36* (2013.01); *C08K 9/00* (2013.01); *G03F 7/091* (2013.01)

(58) Field of Classification Search
None
See application file for complete search history.

(56) References Cited

U.S. PATENT DOCUMENTS

| | | | |
|---|---|---|---|
| 6,129,980 A | 10/2000 | Tsukada et al. | |
| 7,323,514 B2 | 1/2008 | Jing et al. | |
| 7,659,352 B2 | 2/2010 | Wang et al. | |
| 9,611,395 B2 | 4/2017 | Cho et al. | |
| 2006/0269733 A1 | 11/2006 | Mizuno et al. | |
| 2007/0286993 A1* | 12/2007 | Radcliffe ................ G02B 1/111 428/212 |
| 2008/0032053 A1 | 2/2008 | Kourtakis et al. | |
| 2008/0088925 A1 | 4/2008 | Yoneyama et al. | |
| 2010/0189971 A1 | 7/2010 | Isono et al. | |
| 2010/0196687 A1 | 8/2010 | Isono et al. | |
| 2010/0311868 A1* | 12/2010 | Bekiarian ............. B82Y 30/00 523/218 |
| 2011/0288231 A1 | 11/2011 | Obata et al. | |
| 2012/0142867 A1 | 6/2012 | Iwasaki et al. | |
| 2012/0200933 A1 | 8/2012 | Akiyama et al. | |
| 2013/0216819 A1 | 8/2013 | Kim et al. | |

(Continued)

FOREIGN PATENT DOCUMENTS

| | | |
|---|---|---|
| EP | 3248776 A1 | 11/2017 |
| JP | 11-030706 A | 2/1999 |
| JP | 2003222704 A | 8/2003 |

(Continued)

OTHER PUBLICATIONS

English Machine Translation of JP2008107792 (2008).*
English Machine Translation of JP2012144606 (2012).*
English machine translation WO2012157682 (2012).*

*Primary Examiner* — Kenneth J Stachel
(74) *Attorney, Agent, or Firm* — Dentons US LLP

(57) ABSTRACT

The present invention relates to a photocurable coating composition for forming a low refractive layer, a method for preparing an antireflection film using the photocurable coating composition, and an anti-reflective film prepared by using the photocurable coating composition. According to the present invention, a low refractive layer is formed of a photocurable coating composition containing two or more types of photo-polymerizable compounds, a photoinitiator, surface-treated hollow inorganic nanoparticles, and surface-treated solid inorganic nanoparticles.

10 Claims, No Drawings

(56) References Cited

U.S. PATENT DOCUMENTS

2013/0329297 A1 * 12/2013 Hayashi ............ G02F 1/133502
359/601

FOREIGN PATENT DOCUMENTS

| | | | |
|---|---|---|---|
| JP | 2004170901 | A | 6/2004 |
| JP | 2004-238481 | A | 8/2004 |
| JP | 2006-139254 | A | 6/2006 |
| JP | 2008-107792 | A | 5/2008 |
| JP | 2009217258 | A | 9/2009 |
| JP | 4341999 | B2 | 10/2009 |
| JP | 4506918 | B2 | 7/2010 |
| JP | 2012144606 | A * | 8/2012 |
| JP | 2014-077064 | A | 5/2014 |
| JP | 5526468 | B2 | 6/2014 |
| JP | 5680372 | B2 | 3/2015 |
| JP | 5771967 | B2 | 9/2015 |
| KR | 10-2007-0089976 | A | 9/2007 |
| KR | 10-2009-0046873 | A | 5/2009 |
| KR | 10-2011-0102324 | A | 9/2011 |
| KR | 10-2011-0121233 | A | 11/2011 |
| KR | 10-2012-0052275 | A | 5/2012 |
| KR | 10-1173451 | B1 | 8/2012 |
| KR | 10-1189196 | B1 | 10/2012 |
| KR | 10-1237822 | B1 | 2/2013 |
| KR | 10-2013-0078529 | A | 7/2013 |
| KR | 10-1304381 | B1 | 9/2013 |
| KR | 10-2014-0006922 | A | 1/2014 |
| KR | 10-1405076 | B1 | 7/2014 |
| KR | 10-2015-0029560 | A | 3/2015 |
| KR | 10-1507208 | B1 | 4/2015 |
| KR | 10-2015-0137198 | A | 12/2015 |
| KR | 10-2016-0045593 | A | 4/2016 |
| WO | WO-2012157682 | A1 * | 11/2012 ............ G02B 1/111 |

\* cited by examiner

PHOTOCURABLE COATING COMPOSITION FOR FORMING LOW REFRACTIVE LAYER

CROSS-REFERENCE TO RELATED APPLICATION(S)

This application is a National Stage Entry of International Application No. PCT/KR2017/001609 filed on Feb. 14, 2017, and claims the benefit of Korean Application No. 10-2016-0019945 filed on Feb. 19, 2016 and Korean Patent Application No. 10-2017-0019349 filed on Feb. 13, 2017, all of which are hereby incorporated by reference in their entirety for all purposes as if fully set forth herein.

TECHNICAL FIELD

The present invention relates to a photocurable coating composition for forming a low refractive layer, a method for preparing an antireflection film using the photocurable coating composition, and an antireflection film prepared by using the photocurable coating composition.

BACKGROUND ART

In general, a flat panel display device such as a PDP or a LCD is equipped with an antireflection film for minimizing the reflection of light incident from the outside.

As a method for minimizing the reflection of light, a method (anti-glare: AG coating) in which a filler such as an inorganic fine particle is dispersed in a resin and coated onto a base film to impart irregularities, a method (anti-reflection: AR coating) of using the interference of light by forming a plurality of layers having different refractive indexes on a base film; or a method for mixing them, etc., exist.

Among them, in the case of the AG coating, the absolute amount of the reflected light is equivalent to that of a general hard coating, but a low reflection effect can be obtained by reducing the amount of light entering the eye using light scattering through irregularities. However, since the AG coating has poor screen sharpness due to the surface irregularities, many studies on AR coating have been recently conducted.

As the film using the AR coating, a multi-layered structure in which a hard coating layer (high refractive layer), a low refractive layer, and the like are laminated on a substrate film has been commercialized. However, in the method of forming a plurality of layers as described above, there is a disadvantage that as the steps of forming each layer are separately performed, the interlayer adhesion (interfacial adhesion) is weak and thus the scratch resistance is lowered.

In addition, previously, a method of adding various nanometer-sized particles (for example, particles of silica, alumina, zeolite, or the like) has been mainly attempted to improve the scratch resistance of the low refractive layer included in the antireflection film. However, when nanometer-sized particles are used as described above, there is a limitation that it is difficult to simultaneously improve scratch resistance while lowering the reflectance of the low refractive layer, and the antifouling property of the low refractive layer is greatly reduced due to the nanometer-sized particles.

Therefore, although many researches have been made to reduce the absolute reflection amount of light incident from the outside and to improve the scratch resistance of the surface and the antifouling property, the degree of improvement in physical properties resulting therefrom is insufficient.

DISCLOSURE

Technical Problem

It is an object of the present invention to provide a photocurable coating composition for forming a low refractive layer.

It is another object of the present invention to provide a method for preparing an antireflection film using the photocurable coating composition.

It is a further object of the present invention to provide an antireflection film prepared by using the photocurable coating composition.

Technical Solution

In the existing antireflection film, the low refractive index has been realized by adding an excess amount of hollow silica to a low refractive layer. However, such an antireflection film has a problem that mechanical properties such as scratch resistance are poor due to the excess amount of hollow silica.

Thus, the present inventors conducted studies on an antireflection film, and found that, when the low refractive layer of the antireflection film has a distributed structure so that surface-treated hollow inorganic nanoparticles and surface-treated solid inorganic nanoparticles can be distinguished from each other in a binder resin capable of bonding with a hard coating layer, high scratch resistance and antifouling property can be simultaneously realized while exhibiting very low reflectance and high light transmittance, and completed the invention.

Hereinafter, a photocurable coating composition for forming a low refractive layer according to a specific embodiment of the present invention, a method for preparing an antireflection film using the photocurable coating composition, and an antireflection film prepared by the above method, will be described.

According to one embodiment of the present invention, a photocurable coating composition for forming a low refractive layer is provided, including: two or more types of photopolymerizable compounds, a photoinitiator, a surface-treated hollow inorganic nanoparticle, and a surface-treated solid inorganic nanoparticle, wherein at least one photopolymerizable compound of the two or more types of photopolymerizable compounds is a compound represented by the following Chemical Formula 1.

[Chemical Formula 1]

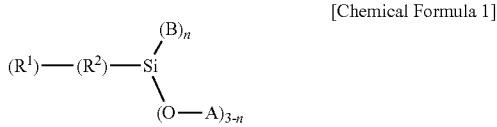

In Chemical Formula 1, $R^1$ is

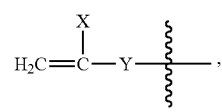

X is any one of hydrogen, a monovalent residue derived from an aliphatic hydrocarbon having 1 to 6 carbon atoms, an alkoxy group having 1 to 6 carbon atoms, and an alkoxycarbonyl group having 1 to 4 carbon atoms, Y is a single bond, —CO—, or —COO—, $R^2$ is a divalent residue derived from an aliphatic hydrocarbon having 1 to 20 carbon atoms, or a divalent residue in which at least one hydrogen of the divalent residue is substituted with a hydroxyl group, a carboxyl group, or an epoxy group, or a divalent residue in which at least one —$CH_2$— of the divalent residue is replaced by —O—, —CO—O—, —O—CO—, or —O—CO—O— so that oxygen atoms are not directly connected thereto, A is either one of hydrogen and a monovalent residue derived from an aliphatic hydrocarbon having 1 to 6 carbon atoms, B is a monovalent residue derived from an aliphatic hydrocarbon having 1 to 6 carbon atoms, and n is an integer of 0 to 2.

The photopolymerizable compound that may be included in the photocurable coating composition according to the one embodiment may include a monomer or oligomer including a (meth)acryloyl group or a vinyl group. In the present specification, the photopolymerizable compound is collectively referred to as a compound that causes a polymerization reaction when irradiated with light, for example, when irradiated with visible light or ultraviolet light. Also, the (meth)acryloyl is meant to include both acryloyl and methacryloyl.

The photocurable coating composition according to the one embodiment includes two or more types of photopolymerizable compounds, and at least one photopolymerizable compound of the two or more types of photopolymerizable compounds (hereinafter referred to as "first photopolymerizable compound") contains a compound represented by Chemical Formula 1.

Unless otherwise specified, the following definitions shall apply to the terms used in the specification.

The monovalent residue derived from an aliphatic hydrocarbon having 1 to 6 carbon atoms may be a linear, branched, or cyclic alkyl group or alkenyl group. Specifically, the monovalent residue derived from an aliphatic hydrocarbon having 1 to 6 carbon atoms may be a linear alkyl group having 1 to 6 carbon atoms, a linear alkyl group having 1 to 3 carbon atoms, a branched or cyclic alkyl group having 3 to 6 carbon atoms, a linear alkenyl group having 2 to 6 carbon atoms, or a branched or cyclic alkenyl group having 3 to 6 carbon atoms. More specifically, the monovalent residue derived from an aliphatic hydrocarbon having 1 to 6 carbon atoms may be a methyl group, an ethyl group, an n-propyl group, an iso-propyl group, an n-butyl group, an isobutyl group, a tert-butyl group, an n-pentyl group, an iso-pentyl group, a neo-pentyl group, an n-hexyl group, a tert-hexyl group, an iso-hexyl group, a neo-hexyl group, or a cyclohexyl group.

The alkoxy group having 1 to 6 carbon atoms may be a linear, branched, or cyclic alkoxy group. Specifically, the alkoxy group having 1 to 6 carbon atoms may be a linear alkoxy group having 1 to 6 carbon atoms, a linear alkoxy group having 1 to 3 carbon atoms, or a branched or cyclic alkoxy group having 3 to 6 carbon atoms. More specifically, the alkoxy group having 1 to 6 carbon atoms may be a methoxy group, an ethoxy group, an n-propoxy group, an iso-propoxy group, an n-butoxy group, an iso-butoxy group, a tert-butoxy group, an n-pentoxy group, an iso-pentoxy group, a neo-pentoxy group, an n-heptoxy group, an iso-heptoxy group, a tert-heptoxy group, a neo-heptoxy group, a cycloheptoxy group, or the like.

The alkoxycarbonyl group having 1 to 4 carbon atoms may have the structure of —CO—$R^a$, wherein $R^a$ may be an alkoxy group having 1 to 4 carbon atoms. Specifically, the alkoxycarbonyl group having 1 to 4 carbon atoms may be —CO—$OCH_3$, —CO—$OCH_2CH_3$, —CO—$OCH_2CH_2CH_3$, or the like.

A single bond means a case where another atom is not present in the portion indicated by Y.

The divalent residue derived from an aliphatic hydrocarbon having 1 to 20 carbon atoms may be a linear, branched, or cyclic alkylene group or alkenylene group.

Specifically, the divalent residue derived from an aliphatic hydrocarbon having 1 to 20 carbon atoms may be a linear alkyl group having 1 to 20 carbon atoms, a linear alkylene group having 1 to 10 carbon atoms, a linear alkylene group having 1 to 5 carbon atoms, a branched or cyclic alkylene group having 3 to 20 carbon atoms, a branched or cyclic alkylene group having 3 to 15 carbon atoms, a branched or cyclic alkylene group having 3 to 10 carbon atoms, a linear alkenylene group having 2 to 20 carbon atoms, or a branched or cyclic alkenylene group having 3 to 20 carbon atoms. More specifically, the divalent residue derived from an aliphatic hydrocarbon having 1 to 20 carbon atoms may be a methylene group, an ethylene group, an n-propylene group, a 1,2-propylene group, an n-butylene group, a 1,2-butylene group, an isobutyl group, or the like.

Non-limiting examples of the divalent residue in which at least one hydrogen of the divalent residue is substituted with a hydroxyl group, a carboxyl group, or an epoxy group include a 1-hydroxypropylene group in which one hydrogen of the propylene group is substituted with a hydroxy group, a 1-carboxypropylene group in which one hydrogen atom of the propylene group is substituted with a carboxyl group, a 1,2-epoxypropylene group in which two hydrogen atoms of the propylene group are substituted with an epoxy group, and the like.

Non-limiting examples of the divalent residue in which at least one —$CH_2$— of the divalent residue is replaced by —O—, —CO—O—, —O—CO—, or —O—CO—O— so that oxygen atoms are not directly connected thereto include —$OCH_2CH_2$—, —CO—$OCH_2CH_2$—, —O—CO—$CH_2CH_2$—, —O—CO—$OCH_2CH_2$—, or the like in which one —$CH_2$— of the propylene group is replaced by —O—, —CO—O—, —O—CO—, or —O—CO—O—.

The first photopolymerizable compound includes an —$R^1$ group that can be polymerized with a photopolymerizable compound other than one of Chemical Formula 1 (hereinafter referred to as "second photopolymerizable compound") to form a binder resin of a low refractive layer, and a —$Si(B)_n(O-A)_{3-n}$ group which can be combined with the hard coating layer. Accordingly, when the first photopolymerizable compound is used, a low refractive layer bonded to the hard coating layer can be formed. In addition, the —$Si(B)_n(O-A)_{3-}$ group of the first photopolymerizable compound binds or interacts with the surface-treated hollow inorganic nanoparticles and the surface-treated solid inorganic nanoparticles described later to thereby more strongly fix the surface-treated hollow inorganic nanoparticles and the surface-treated solid inorganic nanoparticles to the binder resin of the low reflective layer. This makes it possible to provide an antireflection film with excellent optical performance and mechanical properties. Meanwhile, the first photopolymerizable compound does not contain an aromatic ring in the —$R^2$ group, and can form a low refractive layer having a low refractive index.

Specifically, as the first photopolymerizable compound, a compound represented by the following Chemical Formula 2 can be used.

[Chemical Formula 2]

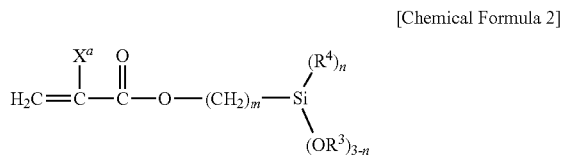

In Chemical Formula 2, $X^a$ is hydrogen or a methyl group, $R^3$ is either one of hydrogen and a monovalent residue derived from an aliphatic hydrocarbon having 1 to 6 carbon atoms, $R^4$ is a monovalent residue derived from an aliphatic hydrocarbon having 1 to 6 carbon atoms, m is an integer of 2 to 6, and n is an integer of 0 to 2.

More specifically, examples of the first photopolymerizable compound include 3-(meth)acryloxypropyltrimethoxysilane, 3-(meth)acryloxypropyltriethoxysilane, 3-(meth)acryloxypropylmethyldimethoxysilane, 3-(meth)acryloxypropylmethyldiethoxysilane, 3-[3-(meth)acryloxypropyleneoxy]propyltrimethoxysilane, or a mixture thereof.

The second photopolymerizable compound which is a photopolymerizable compound other than one of Chemical Formula 1 may include a monomer or oligomer containing one or more, two or more, or three or more (meth)acryloyl groups or vinyl groups.

Specific examples of the monomer or oligomer containing a (meth)acryloyl group include pentaerythritol tri(meth)acrylate, pentaerythritol tetra(meth)acrylate, dipentaerythritol penta(meth)acrylate, dipentaerythritol hexa(meth)acrylate, tripentaerythritol hepta(meth)acrylate, trilene diisocyanate, xylene diisocyanate, hexamethylene diisocyanate, trimethylolpropane tri(meth)acrylate, trimethylolpropane polyethoxy tri(meth)acrylate, ethylene glycol di(meth)acrylate, butanediol di(meth)acrylate, 2-hydroxyethyl (meth)acrylate, 2-ethylhexyl (meth)acrylate, butyl (meth)acrylate, or a mixture of two or more thereof, or a urethane-modified acrylate oligomer, an epoxide acrylate oligomer, an ether acrylate oligomer, a dendritic acrylate oligomer, or a mixture of two or more thereof.

Specific examples of the monomer or oligomer containing a vinyl group may include oligomers or the like obtained by polymerizing divinylbenzene, styrene, para-methyl styrene, or more than one type thereof. The molecular weight of the oligomer may be adjusted to be 1000 to 10,000 g/mol.

The content of the photopolymerizable compound in the photocurable coating composition is not particularly limited, but in consideration of the mechanical properties and the like of the finally produced low refractive layer, the content of the photopolymerizable compound in the solid content of the photocurable coating composition may be adjusted to be 5% to 80% by weight. In the present specification, the content of the photopolymerizable compound means the total sum of the contents of the first and second photopolymerizable compounds. In addition, the solid content of the photocurable coating composition means only a solid component in the photocurable coating composition, excluding a liquid component, for example components such as an organic solvent that can be optionally contained as described below.

Further, the first photopolymerizable compound and the second photopolymerizable compound may be used in a weight ratio of 0.001:1 to 4:1, 0.01:1 to 3:1, 0.1:1 to 2:1, or 0.5:1 to 1.5:1.

Within this range, it is possible to be strongly attached to the hard coating layer and to strongly fix the surface-treated hollow inorganic nanoparticles and the surface-treated solid inorganic nanoparticles. It is also possible to provide a low refractive layer exhibiting low reflectance and showing excellent scratch resistance and antifouling properties.

The photocurable coating composition may further include a fluorine-containing compound including a photoreactive functional group. In the present specification, a fluorine-containing compound including a photoreactive functional group means a compound having a weight average molecular weight of 2000 g/mol or more and substituted with fluorine, and such a compound is defined as not being included in the definition of the photopolymerizable compound described above.

At least one photoreactive functional group is introduced into the fluorine-based compound, and the photoreactive functional group refers to a functional group which can participate in a polymerization reaction by irradiation of light, for example, by irradiation of visible light or ultraviolet light. The photoreactive functional group may include various functional groups known to be able to participate in a polymerization reaction by irradiation of light. Specific examples thereof include a (meth)acryloyl group, an epoxy group, a vinyl group, a mercapto group, or the like. The at least one photoreactive functional group may be composed of any one of the functional groups listed or at least two selected from the functional groups listed.

The fluorine-containing compound including a photoreactive functional group may further contain silicon, or a side chain or a repeating unit derived from a silicon compound. When the fluorine-containing compound includes silicon, or a side chain or a repeating unit derived from a silicon compound, the content of silicon can be 0.1% to 20% by weight based on the fluorine-containing compound. The silicon contained in the fluorine-containing compound including the photoreactive functional group can increase compatibility with other components included in the photocurable coating composition of the embodiment and thus have a role of preventing the occurrence of haze in the low refractive layer obtained from the photocurable coating composition of the embodiment, thereby enhancing transparency. On the other hand, if the content of silicon in the fluorine-containing compound including the photoreactive functional group is excessively large, compatibility between the other components contained in the photocurable coating composition and the fluorine-containing compound may be lowered, whereby the low refractive layer or the antireflection film does not exhibit sufficient transparency or antireflection performance and the antifouling property of the surface may also be lowered.

The fluorine-containing compound including the photoreactive functional group may have a weight average molecular weight of 2000 to 200,000 g/mol or 5000 to 100,000 g/mol. When the weight average molecular weight of the fluorine-containing compound including the photoreactive functional group is too small, the fluorine-containing compound is not uniformly arranged on the surface of the low refractive layer obtained from the photocurable coating composition and is located inside. Thus, the antifouling property of the low refractive layer and the crosslinking density of the low refractive layer are lowered, so that the mechanical properties such as the overall strength and scratch resistance of the antireflection film may be deteriorated. On the other hand, if the weight average molecular weight of the fluorine-containing compound including the photoreactive functional group is too large, compatibility with other components contained in the photocurable coating composition may be lowered, and thus the haze of the finally prepared low refractive layer is increased, the light transmittance may be lowered, and the strength of the low refractive layer may also be lowered. In the present specification, the weight average molecular weight refers to a converted value with respect to standard polystyrene, as measured by gel permeation chromatography (GPC).

Specifically, the fluorine-containing compound including the photoreactive functional group may be: i) an aliphatic compound or an aliphatic cyclic compound in which at least one photoreactive functional group is substituted and at least one hydrogen is substituted with fluorine; ii) a silicone-based compound in which at least one carbon of the aliphatic compound or aliphatic cyclic compound is substituted with silicon; iii) a siloxane-based compound in which at least one carbon of the aliphatic compound or aliphatic cyclic compound is substituted with silicon and at least one —CH$_2$— is substituted with oxygen; iv) a fluoropolyether in which at least one —CH$_2$— of the aliphatic compound or aliphatic cyclic compound is substituted with oxygen; or a mixture or copolymer of two or more thereof.

The photocurable coating composition may include 20 to 300 parts by weight of a fluorine-containing compound including a photoreactive functional group based on 100 parts by weight of the photopolymerizable compound. When the fluorine-containing compound including the photoreactive functional group is added in an excess amount relative to the photopolymerizable compound, the coating properties of the photocurable coating composition may be reduced, or the low refractive layer obtained from the photocurable coating composition may not have sufficient durability or scratch resistance. Further, when the amount of the fluorine-containing compound including the photoreactive functional group is too small relative to the photopolymerizable compound, the low refractive layer obtained from the photocurable coating composition may not have sufficient antifouling or scratch resistance properties.

Meanwhile, the photocurable coating composition according to one embodiment includes surface-treated hollow inorganic nanoparticles and surface-treated solid inorganic nanoparticles. In the present specification, the inorganic nanoparticles refer to inorganic nanoparticles having a size of several nanometers to several hundred nanometers derived from an (organic) metal compound or (organic) semimetal compound, the hollow inorganic nanoparticle refers to a particle having a form in which an empty space exists on the surface and/or the inside of the inorganic nanoparticle, and the solid inorganic nanoparticle refers to a particle having a form in which an empty space does not exist therein.

In the low refractive layer formed from the photocurable coating composition of one embodiment, the surface-treated solid inorganic nanoparticles are distributed close to the interface between the low refractive layer and the hard coating layer, and the surface-treated hollow inorganic nanoparticles are distributed close to the surface which is the back surface of the layer making contact with the hard coating layer. Due to the specific distribution of the surface-treated hollow inorganic nanoparticles and the surface-treated solid inorganic nanoparticles, it is possible to provide an antireflection film exhibiting lower reflectance and having improved scratch resistance and antifouling properties.

As the surface-treated solid inorganic nanoparticles for achieving a specific distribution of the surface-treated hollow inorganic nanoparticles and the surface-treated solid inorganic nanoparticles, inorganic nanoparticles having a high density of 0.50 g/cm$^3$ or more as compared with the surface-treated hollow inorganic nanoparticles can be used. Due to such density difference, when the low refractive layer is formed with the photocurable coating composition, the surface-treated solid inorganic nanoparticles can be mainly distributed on the surface close to the hard coating layer, and the surface-treated hollow inorganic nanoparticles can be mainly distributed on the surface farther from the hard coating layer. More specifically, the surface-treated hollow inorganic nanoparticles may be surface-treated inorganic nanoparticles having a density of 1.50 to 3.50 g/cm$^3$, and the surface-treated solid inorganic nanoparticles may be surface-treated inorganic nanoparticles having a density of 2.00 to 4.00 g/cm$^3$.

The surface-treated hollow inorganic nanoparticles are not particularly limited, but surface-treated inorganic nanoparticles having a maximum diameter of about 200 nm or less can be used. Specifically, as the surface-treated hollow inorganic nanoparticles, surface-treated inorganic nanoparticles having a diameter of about 1 to 200 nm or 10 to 100 nm can be used. The surface-treated solid inorganic nanoparticles are not particularly limited, but surface-treated inorganic nanoparticles having a maximum diameter of about 100 nm or less can be used. Specifically, as the surface-treated solid inorganic nanoparticles, surface-treated inorganic nanoparticles having a diameter of about 0.5 to 100 nm or 1 to 30 nm can be used. By using surface-treated inorganic nanoparticles having a diameter in the above range as the surface-treated hollow inorganic nanoparticles and the surface-treated solid inorganic nanoparticles, an antireflection film having excellent mechanical strength and various optical performances can be provided.

The surface-treated hollow inorganic nanoparticles can be used in an amount of 10 to 400 parts by weight, 100 to 300 parts by weight, or 150 to 250 parts by weight based on 100 parts by weight of the photopolymerizable compound. Further, the surface-treated solid inorganic nanoparticles can be used in an amount of 10 to 400 parts by weight, 10 to 200 parts by weight, 10 to 100 parts by weight, or 10 to 50 parts by weight based on 100 parts by weight of the photopolymerizable compound.

When the content of the surface-treated hollow inorganic nanoparticles and the surface-treated solid inorganic nanoparticles is excessive, phase separation between the surface-treated hollow inorganic nanoparticles and the surface-treated solid inorganic nanoparticles may not sufficiently occur, and these nanoparticles may be mixed at the time of forming the low refractive layer. Thereby, the reflectance of the low refractive layer can be increased, and surface irregularities are excessively generated, such that the antifouling property can be reduced. On the other hand, when the content of the surface-treated hollow inorganic nanoparticles and the surface-treated solid inorganic nanoparticles is excessively small, the surface-treated solid inorganic nanoparticles may hardly be distributed mainly in a region close to the interface between the hard coating layer and the low refractive layer, whereby the reflectance of the low refractive layer can be increased.

In the surface-treated hollow inorganic nanoparticles and the surface-treated solid inorganic nanoparticles, particles containing the same type of metal or metalloid or different types of metals or metalloids can be used for the hollow inorganic nanoparticles and the solid inorganic nanoparticles. For example, the hollow silica particles can be used as the hollow inorganic nanoparticles, and the solid silica particles can be used as the solid inorganic nanoparticles.

When such hollow and solid inorganic nanoparticles are used without surface treatment, it is difficult to provide a low refractive layer exhibiting sufficient scratch resistance and antifouling properties. However, according to one embodiment, the hollow and solid inorganic nanoparticles are surface-treated and included in the photocurable coating composition to form a low refractive layer having a higher degree of crosslinking, thereby further improving scratch resistance and antifouling properties.

The hollow and solid inorganic nanoparticles may be surface-treated by reacting with an organic silicon compound containing a photoreactive functional group.

As the photoreactive functional group, a (meth)acrylate group, an epoxy group, a vinyl group, a mercapto group, or the like may be mentioned. Specific examples of the organosilicon compound containing a photoreactive functional group include vinyl trimethoxy silane, vinyl triethoxy silane, vinyl tris(2-methoxyethoxy)silane, 2-(3,4-epoxycyclohexyl) ethyl trimethoxysilane, γ-glycidoxymethyltrimethoxysilane, γ-glycidoxymethyltriethoxysilane, γ-glycidoxyethyltrimethoxysilane, γ-glycidoxyethyltriethoxysilane, γ-glycidoxypropyltrimethoxysilane, γ-glycidoxypropyltriethoxysilane, γ-(β-glycidoxyethoxy)propyltrimethoxysilane, γ-(meth)acryloyloxymethyltrimethoxysilane, γ-(meth)acryloyloxymethyltriethoxysilane, γ-(meth)acryloyloxyethyltrimethoxysilane, γ-(meth)acryloyloxypropyltrimethoxysilane, γ-(meth)acryloyloxy propylmethyldimethoxysilane, γ-(meth)acryloyloxypropyltriethoxysilane, γ-mercaptopropyltrimethoxysilane, and the like. In the surface of the hollow or solid inorganic nanoparticles, one type of photoreactive functional group is introduced by surface-modifying the nanoparticles with one type of organosilicon compound, or two or more types of photoreactive functional groups are introduced by surface-modifying the nanoparticles with two or more types of organic silicon compounds.

The surface-treated hollow inorganic nanoparticles and the surface-treated solid inorganic nanoparticles can be used as a colloid phase dispersed in a dispersion medium. Herein, as the dispersion medium, organic solvents including alcohols such as methanol, isopropyl alcohol, ethylene glycol, butanol, and the like; ketones such as methyl ethyl ketone, methyl isobutyl ketone, and the like; aromatic hydrocarbons such as toluene, xylene, and the like; amides such as dimethylformamide, dimethylacetamide, N-methylpyrrolidone, and the like; esters such as ethyl acetate, butyl acetate, gamma-butyrolactone, and the like; ethers such as tetrahydrofuran, 1,4-dioxane, and the like; or a mixture thereof, can be used. The content of the surface-treated hollow inorganic nanoparticles or the surface-treated solid inorganic nanoparticles in the colloid phase can be appropriately determined in consideration of the content of each inorganic nanoparticle to be used and the viscosity of the photocurable coating composition. As a non-limiting example, the solid content of the surface-treated hollow inorganic nanoparticles or the surface-treated solid inorganic nanoparticles in the colloidal phase may be about 5% to 60% by weight.

As the photoinitiator used in the photocurable coating composition, various initiators known in the technical field to which the invention pertains may be used. As a non-limiting example, a benzophenone-based compound, an acetophenone-based compound, a nonimidazole-based compound, a triazine-based compound, an oxime-based compound, or a mixture of two or more thereof may be used as the photoinitiator.

The photoinitiator may be used in an amount of 1 to 100 parts by weight based on 100 parts by weight of the photopolymerizable compound. If the amount of the photoinitiator is too small, uncured monomers or oligomers may remain in the photocuring step of the photocurable coating composition. If the amount of the photoinitiator is too large, the unreacted initiator may remain as impurities or the crosslinking density may be lowered, and thus the mechanical properties of the produced antireflection film may be deteriorated, or the reflectance may be greatly increased.

The photocurable coating composition according to this embodiment may further include an organic solvent. Non-limiting examples of the organic solvent include ketones, alcohols, acetates, ethers, and mixtures of two or more thereof.

Specific examples of such organic solvent include ketones such as methyl ethyl ketone, methyl isobutyl ketone, acetylacetone, or isobutyl ketone; alcohols such as methanol, ethanol, diacetone alcohol, n-propanol, i-propanol, n-butanol, i-butanol, or t-butanol; acetates such as ethyl acetate, i-propyl acetate, or polyethylene glycol monomethyl ether acetate; ethers such as tetrahydrofuran and propylene glycol monomethyl ether; or a mixture of two or more thereof.

The organic solvent may be added at the time of mixing the respective components contained in the photocurable coating composition, or may be contained in the photocurable coating composition while the respective components are added in a state of being dispersed or mixed in the organic solvent. If the content of the organic solvent in the photocurable coating composition is too small, the flowability of the photocurable coating composition may be reduced, resulting in defects, such as the occurrence of stripes in the finally produced film, or the like. Further, if the organic solvent is added in an excess amount, the solid content is lowered, the coating property is deteriorated, or the formation of uniform coating film becomes difficult, and thus the physical properties and surface properties of the film may be deteriorated, and further defects may occur during the drying and curing processes. Accordingly, the photocurable coating composition may include an organic solvent such that the concentration of the total solids of the components contained becomes 1% to 50% by weight, or 2% to 20% by weight.

On the other hand, according to another embodiment of the present invention, a method for preparing an antireflection film is provided, including the steps of coating and drying the photocurable coating composition on a hard coating layer, and photocuring the dried product obtained in the above step.

The method for preparing an antireflection film according to another embodiment of the present invention as described above can provide an antireflection film according to a method known in the technical field to which the present invention belongs, in addition to forming the low refractive layer using the photocurable coating composition described above.

Specifically, according to the method for preparing an antireflection film, the photocurable coating composition described above can be coated onto the hard coating layer. In this case, various types of hard coating layers known in the technical field to which the present invention belongs can be used as the hard coating layer.

As a non-limiting example, the hard coating layer may include a hard coating layer including a photocurable resin and an antistatic agent dispersed in the photocurable resin.

The photocurable resin may be a polymer in which the photopolymerizable compound is polymerized by light such as ultraviolet rays, and may be a conventional resin known in the technical field to which the present invention belongs. As a non-limiting example, the photocurable resin may be a polymer of a polyfunctional (meth)acrylate-based monomer or oligomer, wherein the number of (meth)acrylate-based functional groups is 2 to 10, preferably 2 to 8, and more preferably 2 to 7, which is advantageous in terms of securing the physical properties of the hard coating layer. Specifically, the photocurable resin may be a polymer of at least one polyfunctional (meth)acrylate-based monomer selected from the group consisting of pentaerythritol tri(meth)acrylate, pentaerythritol tetra(meth)acrylate, dipentaerythritol penta(meth)acrylate, dipentaerythritol hexa(meth)acrylate, tripentaerythritol hepta(meth)acrylate, trilene diisocyanate, xylene diisocyanate, hexamethylene diisocyanate, trimethylolpropane tri(meth)acrylate, and trimethylolpropane polyethoxy tri(meth)acrylate.

The antistatic agent may be a quaternary ammonium salt compound, a pyridinium salt; a cationic compound having 1 to 3 amino groups; anionic compounds such as sulfonate bases, sulfate ester bases, phosphate ester bases, and phosphonate bases; amphoteric compounds such as amino acid-based or aminosulfate ester-based compounds; non-ionic compounds such as amino alcohol-based compounds, glycerin-based compounds, and polyethylene glycol-based compounds; organometallic compounds such as metal alkoxide compounds including tin, titanium, and the like; metal chelate compounds such as acetylacetonate salts of the organometallic compounds; reactants or high-molecularized compounds of two or more types of the above compounds; or mixtures of two or more types of the above compounds. Here, the quaternary ammonium salt compound may be a compound having at least one quaternary ammonium salt group in the molecule, and a low molecular type or a high molecule type may be used without limitation.

In addition, a conductive polymer and metal oxide fine particles may be used as the antistatic agent. As the conductive polymers, aromatic conjugated poly(paraphenylene), heterocyclic conjugated polypyrrole, polythiophene, aliphatic conjugated polyacetylene, heteroatom-containing conjugated polyaniline, mixed conjugated poly(phenylenevinylene), multichain conjugated compounds that are conjugated systems with multiple conjugated chains in the molecule, and conductive complexes that are obtained by graft or block polymerization of the above conjugated polymer chains to saturated polymers, may be mentioned. In addition, as the metal oxide fine particles, zinc oxide, antimony oxide, tin oxide, cerium oxide, indium tin oxide, indium oxide, aluminum oxide, antimony-doped tin oxide, aluminum-doped zinc oxide, and the like, may be mentioned.

In the hard coating layer including the photocurable resin, an antistatic agent dispersed in the photocurable resin may further include at least one compound selected from the group consisting of an alkoxysilane-based oligomer and a metal alkoxide-based oligomer.

The alkoxysilane-based compound may be one that is conventional in the relevant art, but preferably, it may be at least one compound selected from the group consisting of tetramethoxysilane, tetraethoxysilane, tetraisopropoxysilane, methyltrimethoxysilane, methyltriethoxysilane, methacryloxypropyltrimethoxysilane, glycidoxypropyl trimethoxysilane, and glycidoxypropyl triethoxysilane.

In addition, the metal alkoxide-based oligomer can be prepared through a sol-gel reaction of a composition including a metal alkoxide-based compound and water. The sol-gel reaction can be carried out by a method similar to the above-described method for preparing an alkoxysilane-based oligomer.

However, since the metal alkoxide-based compound can rapidly react with water, the sol-gel reaction can be performed by a method of diluting the metal alkoxide-based compound in an organic solvent and then slowly dripping water thereto. At this time, in consideration of the reaction efficiency or the like, the molar ratio (based on metal oxide ions) of the metal alkoxide-based compound to water is preferably adjusted within the range of 3 to 170.

Herein, the metal alkoxide-based compound may be at least one compound selected from the group consisting of titanium tetra-isopropoxide, zirconium isopropoxide, and aluminum isopropoxide.

The hard coating layer can have a thickness of 0.1 µm to 100 µm.

The hard coating layer may be formed on one surface of the substrate. The specific type and thickness of the substrate are not particularly limited, and a substrate known to be used for the production of the low refractive layer or the antireflection film may be used without any particular limitation.

In the method of preparing the antireflection film, the photocurable coating composition may be coated onto the hard coating layer using methods and apparatuses known in the technical field to which the present invention belongs. For example, the photocurable coating composition can be coated through a bar coating method, such as Meyer bar or the like, a gravure coating method, a 2-roll reverse coating method, a vacuum slot die coating method, a 2-roll coating method, or the like. At this time, the photocurable coating composition may be coated such that the thickness of the low refractive layer formed after photo-curing is 1 nm to 300 nm or 50 nm to 200 nm.

In the coating and drying step of the photocurable coating composition, the coating film obtained after coating the photocurable coating composition may be dried at 35° C. to 100° C. If the drying temperature is out of the above range, phase separation between the surface-treated hollow inorganic nanoparticles and the surface-treated solid inorganic nanoparticles may not sufficiently occur, and the surface-treated hollow inorganic nanoparticles and the surface-treated solid inorganic nanoparticles may be mixed. Thereby, not only the scratch resistance and antifouling property are greatly deteriorated but also the reflectance can be greatly increased. For sufficient phase separation of the surface-treated hollow inorganic nanoparticles and the surface-treated solid inorganic nanoparticles, the drying temperature can be adjusted to about 40° C. to 80° C.

As described above, the surface-treated hollow inorganic nanoparticles and the surface-treated solid inorganic nanoparticles are prepared by utilizing inorganic nanoparticles having a predetermined density difference. When the coating film obtained by coating the photocurable coating composition containing the same is dried in the above temperature range, due to the density differences, the surface-treated solid inorganic nanoparticles can be mainly distributed on the surface close to the hard coating layer and the surface-treated hollow inorganic nanoparticles can be mainly distributed on the surface farther from the hard coating layer. Due to these specific distributions, a low refractive layer having more lowered reflectance, and more improved scratch resistance and antifouling properties, can be provided.

The coating film obtained by coating the photocurable coating composition can be dried in the above temperature range for about 10 seconds to 5 minutes or 30 seconds to 4 minutes. If the drying time is too short, the phase separation between the surface-treated solid inorganic nanoparticles and the surface-treated hollow inorganic nanoparticles described above may not sufficiently occur, and if the drying time is too long, the formed low refractive layer can be eroded by the hard coating layer.

By coating and drying the photocurable coating composition on the hard coating layer as described above, a dried product of the photocurable coating composition coated on the hard coating layer can be obtained. Thereafter, in the step of photocuring the dried product, the dried product of the photocurable coating composition may be photo-cured by irradiating the dried product with ultraviolet light or visible light in the wavelength region of 200 to 400 nm. At this time, the exposure dose of the irradiated light can be adjusted within the range of 100 to 4000 mJ/cm$^2$, and the exposure time is appropriately adjusted depending on the exposure apparatus used, the wavelength of the irradiation beam, or the exposure dose.

The step of photocuring the dried product may be further performed under a nitrogen atmosphere. Thus, a nitrogen purge can be performed before the photo-curing step or during the photo-curing step.

The low refractive layer prepared from the photo-curable coating composition as described above includes: a binder resin produced by performing a crosslinking polymerization of first and second photopolymerizable compounds, and a fluorine-containing compound including a photoreactive functional group which can be used if necessary; and a surface-treated hollow inorganic nanoparticle and a surface-treated solid inorganic nanoparticle that are bonded to or dispersed in the binder resin. In particular, the binder resin can be bonded to the hard coating layer and thus serves to further improve the adhesion of the low refractive layer of the hard coating layer and to more strongly fix the surface-treated hollow inorganic nanoparticles and the surface-treated solid inorganic nanoparticles. The surface-treated hollow inorganic nanoparticles and the surface-treated solid inorganic nanoparticles are distributed so as to be distinguished from each other, and thus the low refractive layer exhibits lower reflectance and higher light transmittance and simultaneously achieves high scratch resistance and anti-fouling properties.

On the other hand, according to another embodiment of the invention, an antireflection film including a hard coating layer; and a low refractive layer formed on one side of the hard coating layer and including a photo-cured product of the photocurable coating composition described above, wherein 70% by volume or more of the entire solid inorganic nanoparticles is present within 50% of the total thickness of the low refractive layer from the interface between the hard coating layer and the low refractive layer, is provided.

The low refractive layer includes a photo-cured product of the photocurable resin composition according to one embodiment. That is, the low refractive layer includes a binder resin produced by performing crosslinking polymerization of a compound represented by Chemical Formula 1 (first photopolymerizable compound) and a photopolymerizable compound (second photopolymerizable compound) other than the compound represented by Chemical Formula 1, and a surface-treated hollow inorganic nanoparticle and a surface-treated solid inorganic nanoparticle that are bonded to or dispersed in the binder resin. Further, 70% by volume or more of the entire solid inorganic nanoparticles included in the low refractive layer are present within 50% of the total thickness of the low refractive layer from the interface between the hard coating layer and the low refractive layer.

In the present specification, "70% by volume or more of the entire surface-treated solid inorganic nanoparticles are present in a specific region" is defined in the sense that in the cross-section of the low refractive layer described above, the surface-treated solid inorganic nanoparticles are mostly present in the specific region. Specifically, 70% by volume or more of the entire surface-treated solid inorganic nanoparticles can be confirmed by measuring the total volume of the surface-treated solid inorganic nanoparticles. In the present specification, the content of the surface-treated inorganic nanoparticles present in a specific region is determined by the content of the surface-treated inorganic nanoparticles present in a specific region, except for the content of the surface-treated inorganic nanoparticles present across the interface of different regions.

The surface-treated hollow inorganic nanoparticles are mainly distributed on the surface which is the back surface of the layer making contact with the hard coating layer. Specifically, 30% by volume or more of the surface-treated hollow inorganic nanoparticles may be present at a greater distance from the interface between the hard coating layer and the low refractive layer in the thickness direction of the low refractive layer than the treated solid inorganic nanoparticles. That is, only the surface-treated hollow inorganic nanoparticles are present in the region having a predetermined thickness from the surface of the low refractive layer which is the back surface of the surface making contact with the hard coating layer, wherein the content of the surface-treated hollow inorganic nanoparticles can be 30% by volume or more of the total.

More specifically, 70% by volume or more of the entire surface-treated solid inorganic nanoparticles may be present within 30% of the total thickness of the low refractive layer from the interface between the hard coating layer and the low refractive layer. In addition, 70% by volume or more of the surface-treated hollow inorganic nanoparticles may be present in a region exceeding 30% of the total thickness of the low refractive layer from the interface between the hard coating layer and the low refractive layer.

As the surface-treated solid inorganic nanoparticles are mainly distributed close to the interface between the hard coating layer and the low refractive layer in the low refractive layer of the antireflection film, and the surface-treated hollow inorganic nanoparticles are mainly distributed on the opposite surface of the interface, two or more portions or two or more layers having different refractive indices from each other may be formed in the low refractive layer, so that the reflectance of the antireflection film may be lowered.

Specifically, the low refractive layer may include a first layer containing 70% by volume or more of the entire surface-treated solid inorganic nanoparticles, and a second layer containing 70% by volume or more of the entire surface-treated hollow inorganic nanoparticles, and the first layer may be located closer to the interface between the hard coating layer and the low refractive layer than the second layer. As described above, in the low refractive layer of the antireflection film, the surface-treated solid inorganic nanoparticles are mainly distributed close to the interface between the hard coating layer and the low refractive layer, and the surface-treated hollow inorganic nanoparticles are mainly distributed on the opposite surface of the interface. It is thereby possible to form an independent layer in which a region where each of the surface-treated solid inorganic nanoparticles and the surface-treated hollow inorganic nanoparticles are mainly distributed is visually confirmed within the low refractive layer.

Such an antireflection film can achieve lower reflectance as compared with the reflectance that could previously be obtained using inorganic nanoparticles. Specifically, the antireflection film may exhibit an average reflectance of 0.7% or less, 0.6% or less, or 0.55% or less in the visible light wavelength band region of 380 nm to 780 nm.

In the antireflection film, the low refractive layer may have a thickness of 1 nm to 300 nm or 50 nm to 200 nm.

As described above, in the antireflection film, since the binder resin contained in the low refractive layer can be bonded to the hard coating layer, the adhesion between the low refractive layer and the hard coating layer is excellent, and the surface-treated solid inorganic nanoparticles are mainly distributed close to the interface between the hard coating layer and the low refractive layer and the surface-treated hollow inorganic nanoparticles are mainly distributed on the opposite surface of the interface, thereby the antireflection film can achieve lower reflectance as compared with the actual reflectance that could previously be obtained using inorganic nanoparticles, and further achieve high scratch resistance and antifouling properties.

Advantageous Effects

According to the present invention, an antireflection film capable of simultaneously achieving high scratch resistance and antifouling properties while exhibiting low reflectance and high light transmittance may be provided.

DETAILED DESCRIPTION OF THE EMBODIMENTS

The actions and effects of the invention will be described in more detail through concrete examples of the invention below. However, these examples are given for illustrative purposes only, and these examples are not intended to limit the scope of the invention in any way.

Preparation Example 1: Preparation of Hard Coating Film

A salt-type of antistatic hard coating solution (manufactured by KYOEISHA Chemical, solid content: 50 wt %, product name: LJD-1000) was coated onto a triacetyl cellulose film with a #10 Meyer bar, and dried at 90° C. for 1 minute. Then, an ultraviolet light of 150 mJ/cm$^2$ was irradiated to the obtained coating film to prepare a hard coating film having a thickness of about 5 to 6 μm.

Example 1: Preparation of Antireflection Films (1) Preparation of Photocurable Coating Composition for Forming Low Refractive Layer 4.14 parts by weight of surface-treated hollow silica nanoparticles (diameter: about 50 to 60 nm, density: 1.96 g/cm3, organosilicon compound: 3-methacryloyloxypropylmethyldimethoxysilane, product name: THRULYA-4320, manufactured by JSC Catalysts and Chemicals), 0.38 parts by weight of surface-treated solid silica nanoparticles (diameter: about 12 nm, density: 2.65 g/cm3, organosilicon compound: 3-methacryloyloxypropylmethyldimethoxysilane), 1.67 parts by weight of a fluorine-containing compound including a photoreactive functional group (RS-537, manufactured by DIC), 0.33 parts by weight of an initiator (Irgacure 127, manufactured by Ciba), and 1.1 parts by weight of 3-methacryloxypropyl methyldimethoxysilane were added with respect to 1 part by weight of pentaerythritol triacrylate (PETA).

Then, MIBK (methyl isobutyl ketone) was added to the obtained composition so that the composition had a solid content concentration of 3.2% by weight.

(2) Preparation of Low Refractive Layer and Antireflection Film

The photocurable coating composition obtained above was coated onto the coating layer of the hard coating film prepared in Preparation Example 1 with a #4 Meyer bar, and dried at 60° C. for 1 minute.

Then, an ultraviolet light of 180 mJ/cm$^2$ was irradiated to the dried coating film under nitrogen purging to form a low refractive layer having a thickness of 110 to 120 nm, thereby producing an antireflection film.

Example 2: Preparation of Antireflection Film

An antireflection film was prepared in the same manner as in Example 1, except that 3-methacryloxypropyltrimethoxysilane was used instead of 3-methacryloxypropylmethyldimethoxysilane in Example 1.

Example 3: Preparation of Antireflection Film

An antireflection film was prepared in the same manner as in Example 1, except that 3-methacryloxypropyltriethoxysilane was used instead of 3-methacryloxypropylmethyldimethoxysilane in Example 1.

Example 4: Preparation of Antireflection Film

An antireflection film was prepared in the same manner as in Example 1, except that 3-acryloxypropyltrimethoxysilane was used instead of 3-methacryloxypropylmethyldimethoxysilane in Example 1.

Example 5: Preparation of Antireflection Film

An antireflection film was prepared in the same manner as in Example 1, except that 3-acryloxypropylmethyldiethoxysilane was used instead of 3-methacryloxypropylmethyldimethoxysilane in Example 1.

Comparative Example 1: Preparation of Antireflection Film

An antireflection film was prepared in the same manner as in Example 1, except that 3-glycidoxypropylmethyldiethoxysilane was used instead of 3-methacryloxypropylmethyldimethoxysilane in Example 1.

Comparative Example 2: Preparation of Antireflection Film

An antireflection film was prepared in the same manner as in Example 1, except that N-phenyl-3-aminopropyltrimethoxysilane was used instead of 3-methacryloxypropylmethyldimethoxysilane in Example 1.

Comparative Example 3: Preparation of Antireflection Film

An antireflection film was prepared in the same manner as in Example 1, except that p-styryltrimethoxysilane was used instead of 3-methacryloxypropylmethyldimethoxysilane in Example 1.

Comparative Example 4: Preparation of Antireflection Film

An antireflection film was prepared in the same manner as in Example 1, except that 3-methacryloxypropylmethyldimethoxysilane used in Example 1 was not used.

Test Examples: Measurement of Physical Properties of Antireflection Films

The following experiments were conducted for the antireflection films obtained in the examples and comparative examples.

1. Measurement of Average Reflectance of Antireflection Film

The average reflectance of the antireflection films obtained in the examples and comparative examples showing in the visible light range (380 to 780 nm) was measured using Solidspec 3700 (SHIMADZU) equipment.

2. Measurement of Scratch Resistance

The surfaces of the antireflection films obtained in the examples and comparative examples were rubbed while applying a specific load to steel wool (#0000) and reciprocating ten times at a speed of 27 reciprocations per minute.

When observed with the naked eye under ceiling illumination of a 50 W LED, the maximum load at which scratches were not generated was measured.

The above load is defined as weight (g) per area of 2 cm in width and 2 cm in height (2*2 $cm^2$).

3. Measurement of Antifouling Property

A straight line with a length of 5 cm was drawn with a black permanent marker on the surface of the antireflection films obtained in the examples and comparative examples.

Then, the antifouling property was evaluated by counting the number of rubbing times with a nonwoven cloth until straight lines were erased.

<Measurement Criteria>
○: Erased when rubbed 10 times or less
Δ: Erased when rubbed 11 to 20 times
X: Erased or not erased when rubbed more than 20 times 4. Confirm Phase Separation When 70% by volume or more of the surface-treated solid inorganic nanoparticles in the entire surface-treated solid inorganic nanoparticles (surface-treated solid silica nanoparticles) were present within 30 nm from the hard coating layer, it was determined that phase separation occurred.

examples, it exhibited lower reflectance and more improved scratch resistance as compared with the phase separated structure of the comparative examples. Consequently, by providing the binder resin capable of bonding to the hard coating layer, it was confirmed that the first photopolymerizable compound further reduces the reflectance of the antireflection film and further improves the scratch resistance, and that these effects cannot be realized with a compound having another reactive functional group such as an epoxy group, an amino group, or styryl group.

The invention claimed is:

1. A photocurable coating composition for forming a low refractive layer, comprising two types of photopolymerizable compounds, a fluorine-containing compound including a photoreactive functional group, a photoinitiator, surface-treated hollow inorganic nanoparticles, and surface-treated solid inorganic nanoparticles,
    wherein at least one photopolymerizable compound of the two types of photopolymerizable compounds is 3-(meth)acryloxypropyltrimethoxysilane, 3-(meth)acryloxypropyltriethoxysilane, 3-(meth)acryloxypropylmethyldimethoxysilane, 3-acryloxypropyltrimethoxysilane, or 3-acryloxypropyldiethoxysilane,
    wherein the surface-treated hollow inorganic nanoparticles are present in an amount of 197 parts by weight based on 100 parts by weight of the two types of photopolymerizable compounds,
    wherein the fluorine-containing compound including a photoreactive functional group includes a silicon content of 0.1% to 20% by weight based on the fluorine-containing compound including photoreactive functional group,
    wherein the fluorine-containing compound including a photoreactive functional group is present in an amount of 79 parts by weight based on 100 parts by weight of the two types of photopolymerizable compounds, and
    wherein a weight ratio of the at least one photopolymerizable compound of the two types of photopolymerizable compounds and the other type photopolymerizable compound of the two types of photopolymerizable compound other than the at least one photopolymerizable compound of the two types of photopolymerizable compound is 1.1 to 1.0.

2. The photocurable coating composition of claim 1, wherein a density of the surface-treated hollow inorganic

TABLE 1

| | Example 1 | Example 2 | Example 3 | Example 4 | Example 5 | Comparative Example 1 | Comparative Example 2 | Comparative Example 3 | Comparative Example 4 |
|---|---|---|---|---|---|---|---|---|---|
| Average reflectance [%] | 0.53 | 0.52 | 0.51 | 0.53 | 0.51 | 0.55 | 0.68 | 0.71 | 0.80 |
| Scratch resistance [g] | 700 | 700 | 700 | 650 | 700 | 100 | 100 | 150 | 100 |
| Antifouling property | ○ | ○ | ○ | ○ | ○ | Δ | Δ | Δ | Δ |
| Phase separation | ○ | ○ | ○ | ○ | ○ | ○ | ○ | ○ | ○ |

Referring to Table 1, it was confirmed that when the surface-treated hollow inorganic nanoparticles and the surface-treated solid inorganic nanoparticles were distributed in the binder resin prepared from the compound represented by Chemical Formula 1 (first photo-polymerizable compound) so as to be distinguished from each other, as described in the nanoparticles is 1.96 $g/cm^3$, and wherein a density of the surface-treated solid inorganic nanoparticles is 2.65 $g/cm^3$.

3. A method for preparing an antireflection film comprising the steps of:
    coating the photocurable coating composition of claim 1 on a hard coating layer;

drying the photocurable coating composition coated on the hard coating layer to produce a dried product; and photocuring the dried product.

4. The method for preparing the antireflection film of claim 3, wherein the coating and drying of the photocurable coating composition is carried out at 35° C. to 100° C.

5. An antireflection film comprising:

a hard coating layer; and a low refractive layer formed on one surface of the hard coating layer and including a photo-cured product of the photocurable coating composition of claim 1, wherein 70% by volume or more of the surface-treated solid inorganic nanoparticles relative to the total volume of the surface-treated solid nanoparticles in the low refractive layer are present within 50% of a total thickness of the low refractive layer from an interface between the hard coating layer and the low refractive layer.

6. The antireflection film of claim 5, wherein 30% by volume or more of the surface-treated hollow inorganic nanoparticles relative to the total volume of the surface-treated hollow inorganic nanoparticles in the low refractive layer are present at a greater distance relative to the interface between the hard coating layer and the low refractive layer in a thickness direction of the low refractive layer than any surface-treated solid inorganic nanoparticles in the low refractive layer.

7. The antireflection film of claim 5, wherein the low refractive layer includes a first layer and a second layer, wherein the first layer containing 70% by volume or more of the total amount of the surface-treated solid inorganic nanoparticles relative to the total volume of the surface-treated solid inorganic nanoparticles in the low refractive layer, wherein the second layer containing 70% by volume or more of the surface-treated hollow inorganic nanoparticles relative to the total volume of the surface-treated hollow inorganic nanoparticles in the low refractive layer, and wherein the first layer of the low refractive layer is located closer to the interface between the hard coating layer and the low refractive layer than the second layer of the low refractive layer.

8. The antireflection film of claim 5, wherein an average reflectance of the antireflection film is 0.7% or less in the visible light wavelength band region of 380 nm to 780 nm.

9. The antireflection film of claim 5, wherein 70% by volume or more of the surface-treated solid inorganic nanoparticles relative to the total volume of the surface-treated solid inorganic nanoparticles in the low refractive layer are present within 30% of the total thickness of the low refractive layer from the interface between the hard coating layer and the low refractive layer.

10. The antireflection film of claim 9, wherein 70% by volume or more of the surface-treated hollow inorganic nanoparticles relative to the total volume of the surface-treated hollow inorganic nanoparticles in the low refractive layer are present in a region exceeding 30% of the total thickness of the low refractive layer from the interface between the hard coating layer and the low refractive layer.

\* \* \* \* \*